United States Patent
Lacroix

(10) Patent No.: US 10,776,234 B2
(45) Date of Patent: Sep. 15, 2020

(54) ON-DIE INPUT CAPACITIVE DIVIDER FOR WIRELINE RECEIVERS WITH INTEGRATED LOOPBACK

(71) Applicant: Marc-Andre Lacroix, Ottawa (CA)

(72) Inventor: Marc-Andre Lacroix, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 125 days.

(21) Appl. No.: 16/183,912

(22) Filed: Nov. 8, 2018

(65) Prior Publication Data

US 2020/0151076 A1    May 14, 2020

(51) Int. Cl.
| | | |
|---|---|---|
| G06F 11/00 | (2006.01) | |
| G06F 11/263 | (2006.01) | |
| G06F 11/22 | (2006.01) | |
| H04B 1/40 | (2015.01) | |

(52) U.S. Cl.
CPC .......... *G06F 11/263* (2013.01); *G06F 11/221* (2013.01); *H04B 1/40* (2013.01)

(58) Field of Classification Search
CPC ........ G06F 11/221; G06F 11/263; H04B 1/40
See application file for complete search history.

(56) References Cited

U.S. PATENT DOCUMENTS

| | | | | |
|---|---|---|---|---|
| 4,719,374 A | * | 1/1988 | Bialo ................. | H03K 17/6871 327/430 |
| 6,175,274 B1 | * | 1/2001 | Groe ........................ | H03F 3/72 330/100 |
| 9,306,609 B1 | | 4/2016 | Lacroix | |
| 9,397,623 B1 | | 7/2016 | Lacroix | |
| 9,871,529 B1 | | 1/2018 | Chong et al. | |
| 2008/0150689 A1 | * | 6/2008 | Chiu ........................ | H04B 1/30 340/10.1 |
| 2009/0125746 A1 | | 5/2009 | Rofougaran | |
| 2013/0084799 A1 | * | 4/2013 | Marholev ........... | H03F 3/45179 455/41.1 |

(Continued)

FOREIGN PATENT DOCUMENTS

CN    107251497 A    10/2017

OTHER PUBLICATIONS

"Linear Equalization and PVT-Independent DC Wander Compensation for AC-Coupled PCIe 3.0 Receiver Front End"; IEEE Transactions on Circuits and Systems—II: Express Briefs, vol. 58, No. 5, May 2011.

(Continued)

*Primary Examiner* — Joshua P Lottich

(57) ABSTRACT

There is provided an integrated loopback used for on-die self-test and diagnosis of transceiver faults. According to embodiments, there is provided an interface network including an AC coupling capacitor interposed between input pins of the interface network and an input of an amplifier, a shunt capacitor interposed between the AC coupling capacitor and the input of the amplifier and a selector. The selector includes a mission mode circuit component connected to a bottom plate of the shunt capacitor and the selector is configured to select between a first mode and a second mode, wherein the first mode is mission mode and the second mode is loopback mode, wherein in the second mode the mission mode circuit component forms at least part of a circuit that supplies a loopback signal.

16 Claims, 6 Drawing Sheets

(56) References Cited

U.S. PATENT DOCUMENTS

2015/0198647 A1 7/2015 Atwood et al.
2019/0393849 A1* 12/2019 Lumpkin ................ H03F 3/187

OTHER PUBLICATIONS

"A 1.0625-to-14.025Gb/s Multimedia Transceiver with Full-rate Source-series-Terminated Transmit Driver and Floating-Tap Decision-Feedback Equalizer in 40nm CMOS"; ISSCC 2011/Session 20/High-Speed Transceivers & Building Blocks/20.2.

* cited by examiner

ON-DIE INPUT CAPACITIVE DIVIDER FOR WIRELINE RECEIVERS WITH INTEGRATED LOOPBACK

FIELD OF THE INVENTION

The present invention pertains to the field of wireline serial transceivers, and in particular to built-in and on-die self-test of wireline transceivers.

BACKGROUND

Wireline serial transceivers (SerDes) are ubiquitous in a variety of communication infrastructures, data centers, and terminal chipsets. SerDes are responsible for connecting the digital core of an integrated circuit (chip) with the outside world. The communication speed of SerDes is much faster than the frequency of the digital core of the chip. As a result, SerDes perform functions that include channel equalization, clock and data recovery, retiming, and serialization-deserialization of input symbols and data in order to interface with the chip's digital core. Modern communication chips may include 100 to 200 SerDes or more. This high density of SerDes increases the importance of SerDes with built-in and on-die self-test and diagnostic features.

This background information is intended to provide information that may be of possible relevance to the present invention. No admission is necessarily intended, nor should be construed, that any of the preceding information constitutes prior art against the present invention.

SUMMARY

It is an object of the present invention to obviate or mitigate at least one disadvantage of the prior art.

According to embodiments of present invention, there is provide an on-die input capacitive divider for wireline receivers with integrated loopback. In accordance with an aspect of the present invention, there is provided an interface network including an AC coupling capacitor, a shunt capacitor and a selector. The AC coupling capacitor is interposed between input pins of the interface network and an input of an amplifier. The shunt capacitor is interposed between the AC coupling capacitor and the input of the amplifier. The selector includes a mission mode circuit component connected to a bottom plate of the shunt capacitor and the selector is configured to select between a first mode and a second mode, wherein the first mode is mission mode and the second mode is loopback mode. In the second mode the mission mode circuit component forms at least part of a circuit that supplies a loopback signal.

According to some embodiments, in the second mode the selector forms at least part of an injection element wherein the injection element supplies the loopback signal. In some embodiments, the interface network is a single ended interface network or a differential interface network. In some embodiments, the shunt capacitor has a configurable capacitance or a fixed capacitance. In some embodiments, the selector has a configurable resistance or a fixed resistance. In some embodiments, the configurable resistance of the selector is adjusted to equalize losses occurring as the loopback signal propagates from a transmitter to a receiver. In some embodiments, the second mode the interface network has a transfer function wherein the transfer function is adjusted by configuring one or more of the capacitance of the shunt capacitor and the resistance of the selector.

Embodiments have been described above in conjunctions with aspects of the present invention upon which they can be implemented. Those skilled in the art will appreciate that embodiments may be implemented in conjunction with the aspect with which they are described, but may also be implemented with other embodiments of that aspect. When embodiments are mutually exclusive, or are otherwise incompatible with each other, it will be apparent to those skilled in the art. Some embodiments may be described in relation to one aspect, but may also be applicable to other aspects, as will be apparent to those of skill in the art.

BRIEF DESCRIPTION OF THE FIGURES

Further features and advantages of the present invention will become apparent from the following detailed description, taken in combination with the appended drawings, in which.

It will be noted that throughout the appended drawings, like features are identified by like reference numerals.

DETAILED DESCRIPTION

Figure 1A:
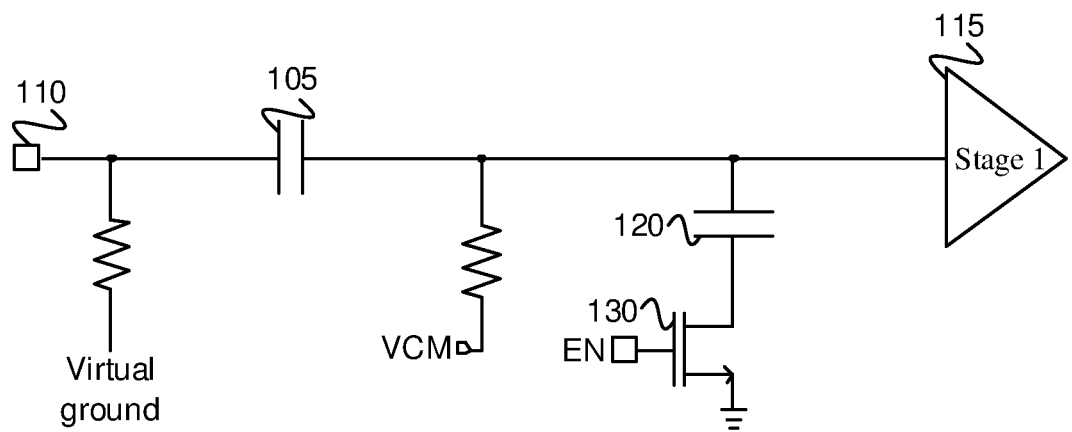
FIGS. 1A to 1C illustrate a single ended AC coupled input network of a SerDes and the serial loopback circuit according to embodiments.

In the following description, features of the present invention are described by way of example embodiments.

SerDes transceivers are complex and can include a receiver, a transmitter, and a clocking sub-system that are coupled within the transceiver. Each transceiver communicates with the chip's core. The ability to self-test and self-diagnose a SerDes is important for both manufacturing test and system level testing of a chip. A system can include hundreds of chips and each chip can include hundreds of SerDes. As a result, simplifying diagnostics of SerDes and their connections can be beneficial.

Internal serial loopback is a method that can simplify diagnosis of faults and connections of a SerDes. Internal serial loopback can transmit data from the transceiver's transmitter. The same transceiver's receiver receives the transmitted information without using connections external to the chip. Since this communication path between a transceiver's transmitter and receiver is internal to the transceiver, diagnostic time can be reduced and SerDes testability can be increased.

A conventional approach to SerDes loopback testing is to inject a signal within the main amplifier chain. A benefit of this approach is the ability to isolate the loopback signal from the far-end transmitter by powering down the first stage of the amplifier. Disadvantages of this approach are that neither the first amplifier stage, nor the interface network are tested and as a result, full functional coverage of the SerDes is not achieved. This approach also adds additional loads onto the main data path which can be detrimental to the mission mode performance of the SerDes.

A second approach to SerDes loopback testing is to apply the loopback signal to the receiver's termination resistors. The advantage of this approach is full functional test coverage because both the interface network and the amplifier's first stage are tested. Disadvantages of this method are that the loopback test circuit is directly DC coupled to the link partner transmitter. This DC coupling can be a problem when the link partner transmitter is not transmitting (as is required in a loopback scenario) as this transmitter may be held in a static state, which can result in a direct path existing for current to flow between the transmitter and the loopback test circuit. Another issue with DC coupling is that the common mode of the transceiver's transmitter and the common mode of the loopback circuit may not be compatible. Additionally, this loop back testing configuration is to be configured to be electrostatic discharge (ESD) robust because the loopback circuit is only isolated by a termination which can be 50Ω. Another drawback of this solution is that the loopback circuit may require a large driver, with a low impedance, to establish a sufficiently strong loopback signal at the far-end transmitter's termination. This solution primarily low pass filters the loopback signal and does not offer isolation from the transmitter.

Figure 1B:
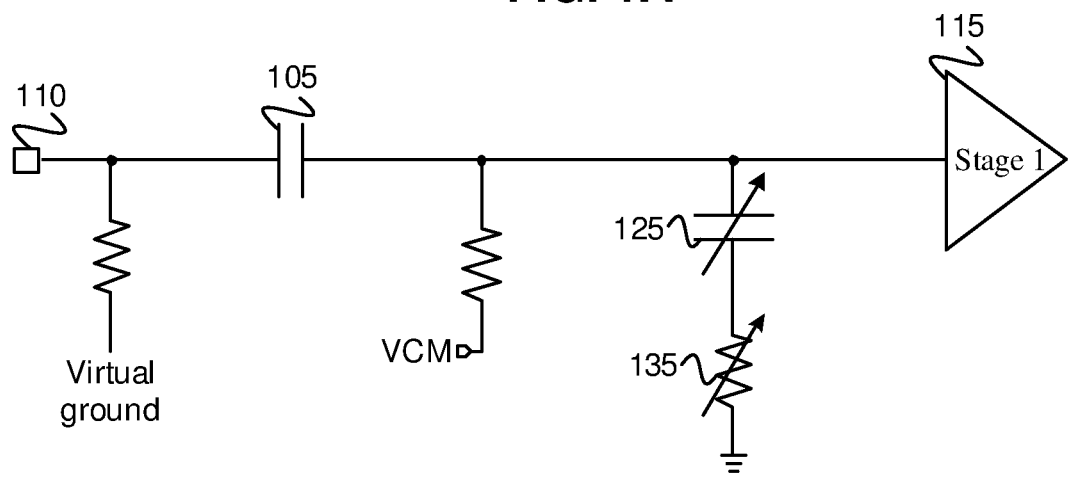
Figure 1C:
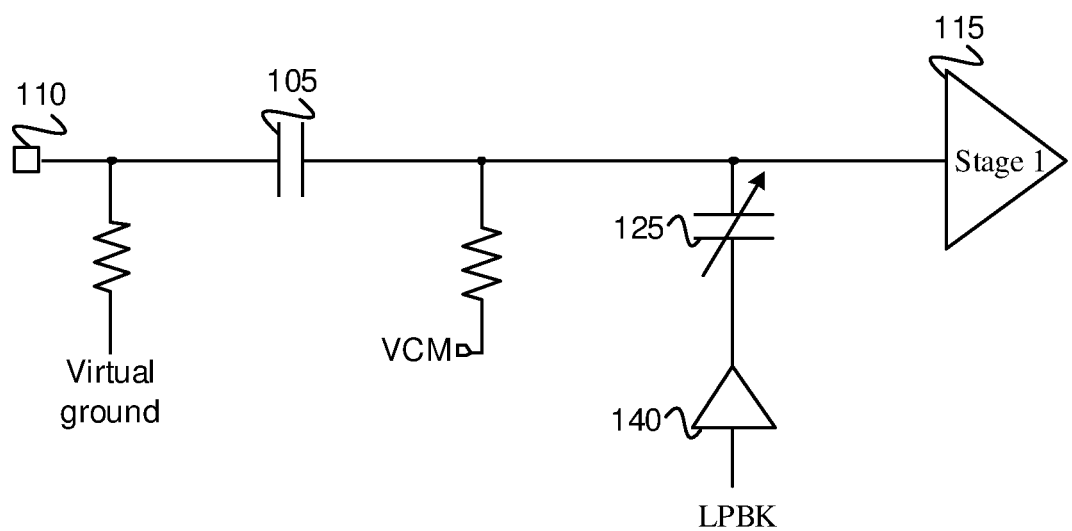

According to embodiments, there is provided an on-die input capacitive divider for wireline receivers with integrated serial loopback that is configured to use the AC coupled input network as a part of the serial loopback. An embodiment of this configuration is illustrated in FIG. 1. This embodiment can provide broader functional coverage and can have a negligible effect on the mission mode of the SerDes. It is also noted that this embodiment does not have DC current or common-mode compatibility issues. The embodiment illustrated in FIGS. 1A to 1C also does not require a driver with a high drive strength to establish the loopback signal across the receiver's input. Furthermore, this embodiment is ESD robust.

The integrated serial loopback circuit illustrated in FIGS. 1A to 1C takes advantage of existing components of an "on-die" AC coupled attenuator (also known as an interface network) to integrate the loopback test function. It is noted that the circuit illustrations of FIGS. 1A to 1C represent variations of circuit realizations depending on the type of activation of the selector 130, as will be further discussed in the subsequent sections. The interface network's transmitters and receivers are on-die and a form of this interface network is the programmable capacitive divider, also on-die. The integrated serial loopback circuit illustrated in FIGS. 1A to 1C features an on-die AC coupling capacitor 105 which is interposed between the transceiver's input pin 110 and the transceiver's receiver amplifier 115. The interface network also includes an additional capacitor, shunt capacitor 120, that is used to attenuate the input signal, when desired, and thus the shunt capacitor 120 can be paired with the activation switch 130. Shunt capacitor 120, as illustrated in FIG. 1A, has a fixed capacitance that is interposed between the AC coupling capacitor and the receiver's amplifier by turning on switch 130. A plurality of switches 130 (selectors) may be used to connect a plurality of shunt capacitors 120 to the receiver amplifier. This ability to select the number of shunt capacitors 120 is a feature that allows the selection of shunt capacitor 120 capacitance for the programmable attenuation of the loopback signal. As a result, the ability to configure (select) the capacitance of the shunt capacitor can be considered to be an adjustable shunt capacitor 125 as illustrated in FIG. 1B. Also, each switch 130 has a fixed resistance when it is turned ON. The ability to turn ON the desired number of switches 130 when programming the attenuation of the loopback signal results in a configurable resistance 135 as illustrated in FIG. 1B.

The integrated loopback test circuit illustrated by FIGS. 1A to 1C integrates the loopback within the interface network, i.e. on-die, where the loopback signal is supplied to the input of the injection element, also on-die, and is the output of an on-die transmitter. This integrated loopback is achieved substantially without adding or modifying the interface network's components. It is noted that reusing the interface network's components does not affect the mission mode path. FIG. 1C illustrates the injection of the loopback signal (LPBK) into the interface network by applying it to the bottom plate of shunt capacitor 125 through buffer 140 when in loopback mode. Buffer 140 is known as an injector because it injects the loopback signal into the interface network during loopback mode. Buffer 140 includes switch (transistor) 130 by repurposing switch 130 as part of the injection element during loopback mode. Therefore, since the core components are substantially the same in loopback test mode as they are in mission mode, the transfer function of the interface network in loopback mode is complementary of the interface network's mission mode transfer function. This complementary transfer function allows for full functional test coverage of the on-die AC coupled interface network. Since the loopback signal is injected on the receive side of AC coupling capacitor 105, this embodiment of the loopback test circuit is ESD robust and also immune to the DC state of the transmitter connected to the mission mode input 110 of the interface network. Also, it is noted that no DC current flows between the loopback test circuit as capacitor 105 can fully block DC current. It is understood that the instant configuration eliminates common-mode compatibility as an issue because capacitor 105 separates the domains. Furthermore, the illustrated embodiment does not require a high drive strength driver because the voltage transfer to the input of amplifier 115 is achieved by the reverse capacitive divider that establishes a steady-state level substantially without "fighting with" or mitigating the high-strength far-end transmitter. The amplitude of this steady-state loopback signal can be adjusted by adjusting the capacitance ratio of the AC coupling capacitor 105 and the shunt capacitor 125 (or 120).

It is understood that according to embodiments, an injection element considered to be a transconductance based apparatus that receives a loopback signal as an input and re-generates the input as an output thereof. For example, an injection element can be a driver, a buffer, an amplifier or other transconductance based apparatus as defined above. As an example, an amplifier may have a unity gain (thus acting as a buffer), positive gain or can attenuate an input signal.

With further reference to the embodiment illustrated in FIGS. 1A to 1C, full functional coverage can achieved because injection of the loopback signal occurs on the reverse path. The reverse path is complementary to the transfer function of the interface network operating in mission mode. The simplified mission mode transfer function of the interface network, is given by EQUATION 1, wherein low and very high frequency pole-zero behaviour is ignored. Capacitor $C_1$ represents capacitor 125 in EQUATION 1 and EQUATION 2 and $C_2$ represents capacitor 105.

$$G_f = C_2/(C_2 + C_1) \qquad (1)$$

The transfer function of the reverse path is given by EQUATION 2.

$$G_r = C_1/(C_2+C_1) \quad (2)$$

EQUATION 2 is complementary of the mission mode transfer function described by EQUATION 1. Therefore, the impact of each component can be understood and validated using the loopback path. It is noted that in the serial loopback circuit illustrated in FIGS. 1A to 1C, no extra capacitors need to be added because the mission mode capacitors are repurposed during loopback. Adding extra capacitors loads the interface network and degrades mission mode performance. Therefore, it is important that loopback test circuit has substantially no impact on the mission mode and still meets the functional test coverage goals.

Figure 2:
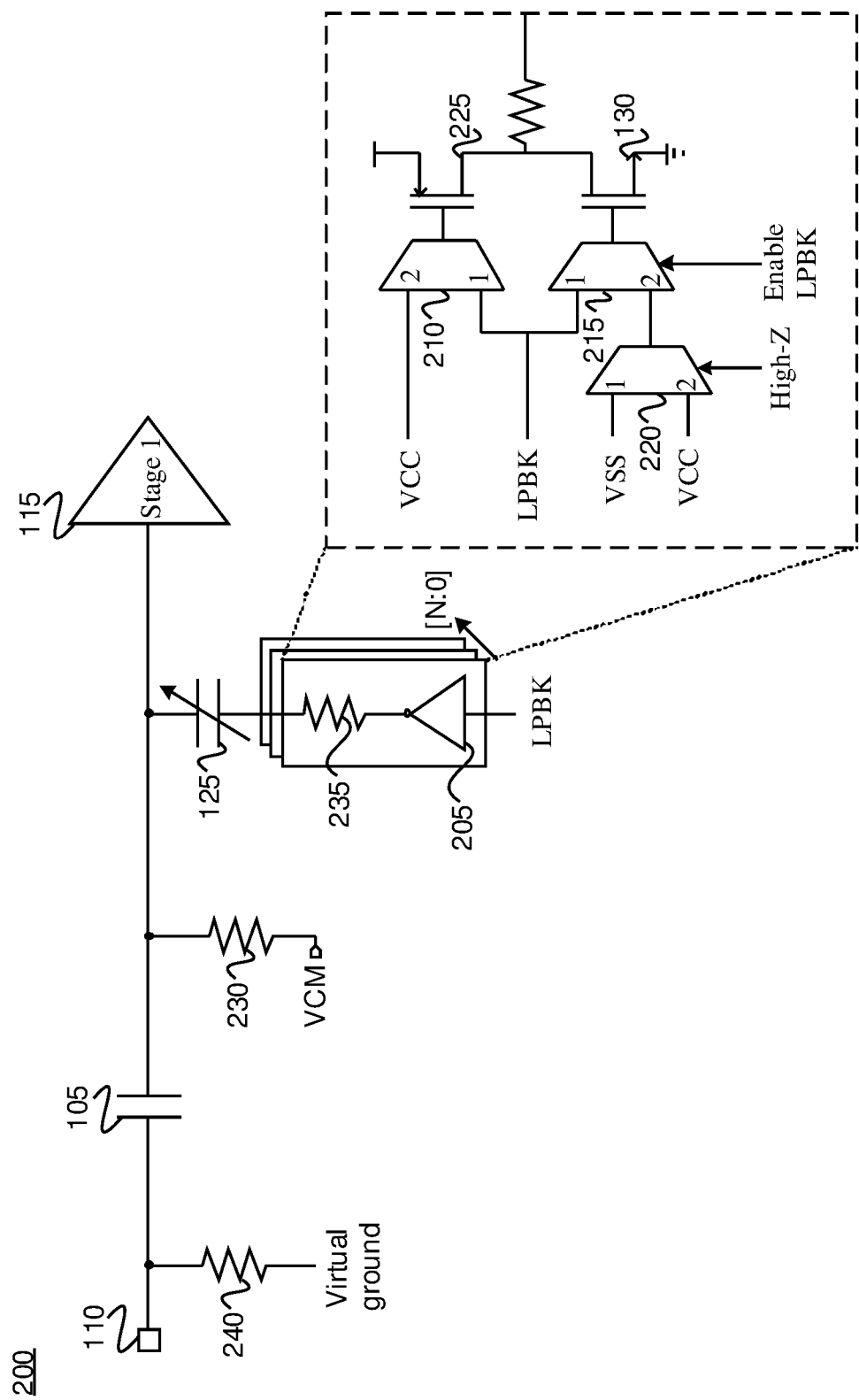
FIG. 2 illustrates a single ended AC coupled input network of a SerDes and a serial loopback circuit according to embodiments.

FIG. 2 illustrates the serial loopback circuit with a plurality of buffers 205 and resistors 235. Buffer 205 and resistor 235 apply the loopback signal to shunt capacitor 125. Capacitor 125 is recycled from mission mode. Each buffer 205 (i.e. injection element) includes a driver, a buffer, or an amplifier to ensure sufficient signal strength is applied to shunt capacitor 125. Transistor 130 from the mission mode circuit is also reused within the loopback circuit. Buffer 205 can be configured to allow substantially seamless switching between loopback or nominal operation of the capacitive divider while ensuring proper operation for each mode. Loopback test mode is implemented using selectors 210, 215, and 220. In mission mode, buffer 205 pulls to ground, or to supply, as was the case with capacitor switch 130. Capacitor 125 loads capacitor 105 as previously illustrated in FIG. 1. The resistance of switch 130 at full overdrive, ON-resistance ($R_{ON}$), is that of the existing control switch. This resistance can be adjusted by increasing the size of the buffer or by increasing the number of parallel buffers. Since the injection of the loopback signal occurs by applying the signal to the capacitor divider, a buffer with a small drive strength can be used. In mission mode, the size of transistor 130 can be selected so as to realize a specific transfer function zero for the mission mode transfer function.

Loopback can be established by selection port 1 on selector 210 and 215. The LPBK signal is selected for propagation to the buffer (transistors 225 and 130) which then applies LPBK to capacitor 125. Injection of the loopback signal through attenuation capacitors 105 and 125 transfers the LPBK signal to the stage-1 input (amplifier 115) through capacitor divider described by EQUATION 3. Capacitor $C_1$ represents capacitor 125 in EQUATION 3 and $C_2$ represents capacitor 105.

$$C_1/(C_2+C_1) \quad (3)$$

The capacitor divider described by EQUATION 3 is complementary of the mission mode path and therefore allows visibility and test coverage of the transceiver's components. Since capacitor 125 has less capacitance than capacitor 105, the loopback signal is attenuated more in loopback mode than in the mission mode. However, capacitor 125 is configurable and can be adjusted to control the strength of this loopback test path to reduce the attenuation of the loopback signal if required. Mission mode can be invoked by selecting port 2 on selectors 210, 215, and 220. This disables P-Type metal oxide semiconductor (PMOS) transistor 225 and applies full static overdrive on N-Type metal oxide semiconductor (NMOS) transistor 130. NMOS transistor 130 therefore acts as the normal capacitor selection/activation switch that is present in the embodiment illustrated in FIG. 1. The $R_{ON}$ of NMOS transistor 130 can be reduced by increasing the number of parallel slices with active NMOS devices. For example, the on resistance ($R_{ON}$) of NMOS transistor 130 can be reduced by selecting port 2 on selectors 210, 215, and 220 of the plurality of buffers 205. NMOS transistor 130 is turned OFF by selecting port 1 of selector 220 and effectively puts this transistor into high-impedance. It is also possible to place all slices of buffer 205 into high-impedance and to disable capacitor 125 if desired. Disabling capacitor 125 selects the lowest attenuation of the mission path. The bandwidth of the interface network in loopback mode is as wide-band as the interface network is in mission mode. Resistor 230 enables low frequency coverage and applies equally to the mission path and to the loopback path. The transfer function of the loopback path is described by EQUATION 4.

$$Gr = \frac{\frac{C_1}{(C_2+C_1)} * [1+sC2R2]}{1+s\left[\frac{C_2C_1[R_2+R_1]}{C_2+C_1}\right]} \quad (4)$$

Capacitor $C_1$ in EQUATION 4 represents capacitor 125, capacitor $C_2$ represents capacitor 105, resistor $R_1$ represents resistor 235, and resistor $R_2$ represents resistor 240. A benefit of the embodiment of the loopback circuit illustrated by FIG. 2 can be noted in the numerator of EQUATION 4. The AC coupling capacitor 105 forms a zero with resistor 240. Resistor 240 may be composed of the receiver side termination or it may be the parallel combination of both the transmitter's and the receiver's terminations. The receive side termination typically is present in a transceiver. The loopback transfer function described by EQUATION 1 of the interface network has a transfer function that is adjusted by configuring the capacitance of one or more of the shunt capacitor and the resistance of the selector. This loopback test circuit's transfer function includes an intrinsic zero which can help equalize losses that may occur as the loopback signal propagates from the transmitter to receiver buffer 205. The loopback transfer function features a pole which is dependant on the parallel combination of capacitors 105 and 125 (which can be defined as $C_p=(C_1*C_2)/(C_1+C_2)$ where $C_p<<C_2$) and the sum of resistors 240 and 235. The resistance of resistor 235 is selectable by controlling the number of buffers 205 (slices) that are activated. The resistance of resistor 235, therefore, can be adjusted to either cancel the zero and achieve an overall flat response or can be used to move the pole upward in frequency resulting in a peaked transfer function. The ability to select either an intrinsic flat bandwidth or equalization (known to a person skilled in the art as a peaked transfer function) can be a benefit of embodiments of the loopback circuit compared to other loopback test implementations, at least in part, because flat and peaked transfer functions can be achieved with minimal added complexity. The interface network in serial loopback mode, illustrated in FIG. 2, enables full functional test coverage with minimal overhead and also with little impact on the mission mode when inactive. This embodiment of the interface network does not require additional ESD protection since the interface network in loopback mode is ESD robust and is also isolated from the transmitter at DC. This embodiment of the interface network supports modes of operation where the transmitter is held in a static active state ensuring no DC current flows and also has no common mode compatibility issues. This embodiment features an intrinsic transfer function zero which can be useful for equalizing the transmit signal. This embodiment also features a programmable pole that can be tuned by the number of slice buffers 205 in the circuit to achieve an intrinsic flat transfer function over frequency.

Figure 3:
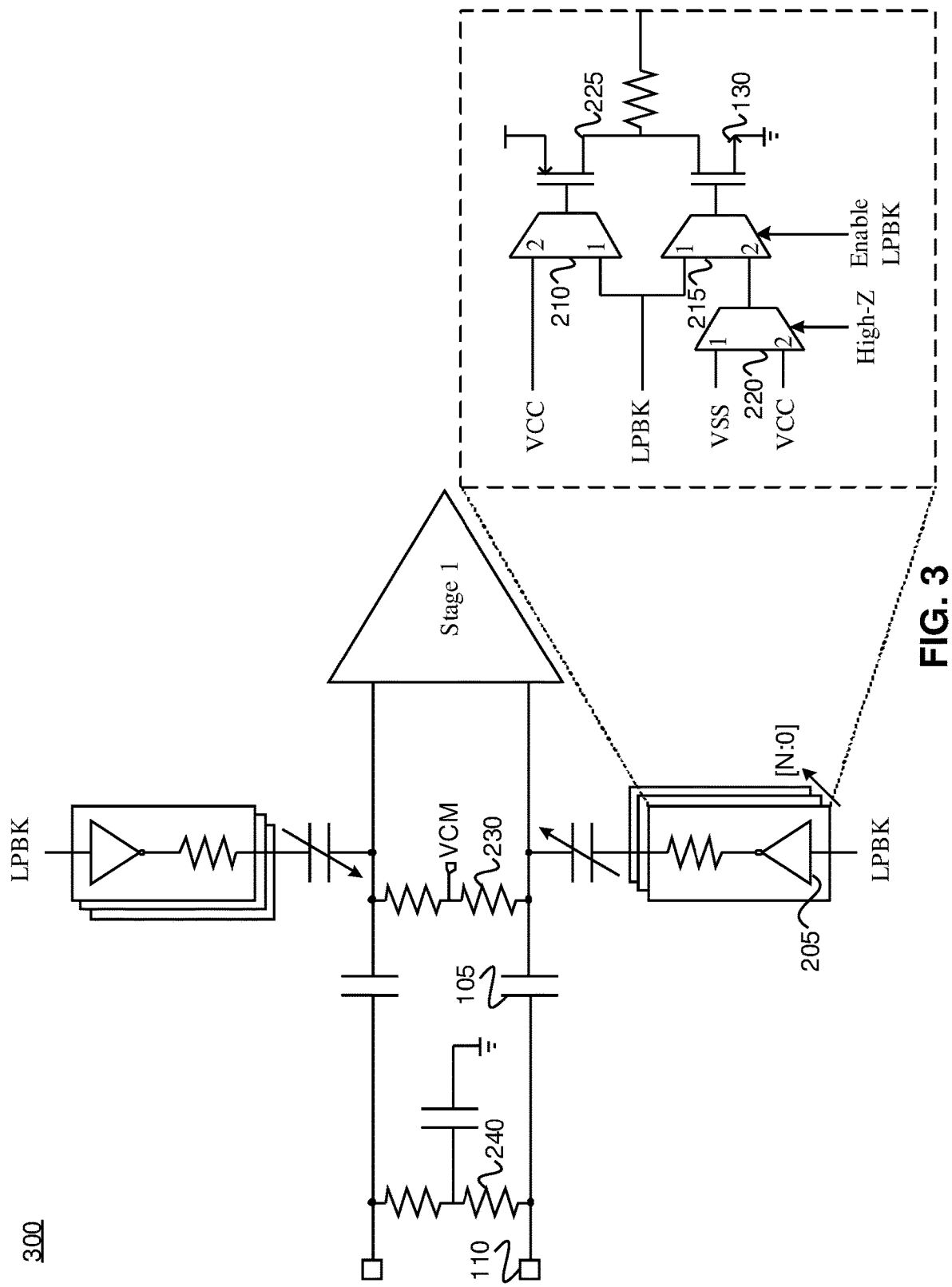
FIG. 3 illustrates a differential AC coupled input network of a SerDes and a serial loopback circuit according to embodiments.

FIG. 3 illustrates an embodiment of a full differential interface network. The operation of this embodiment is the same as the single ended embodiment illustrated by FIG. 2.

Figure 4:
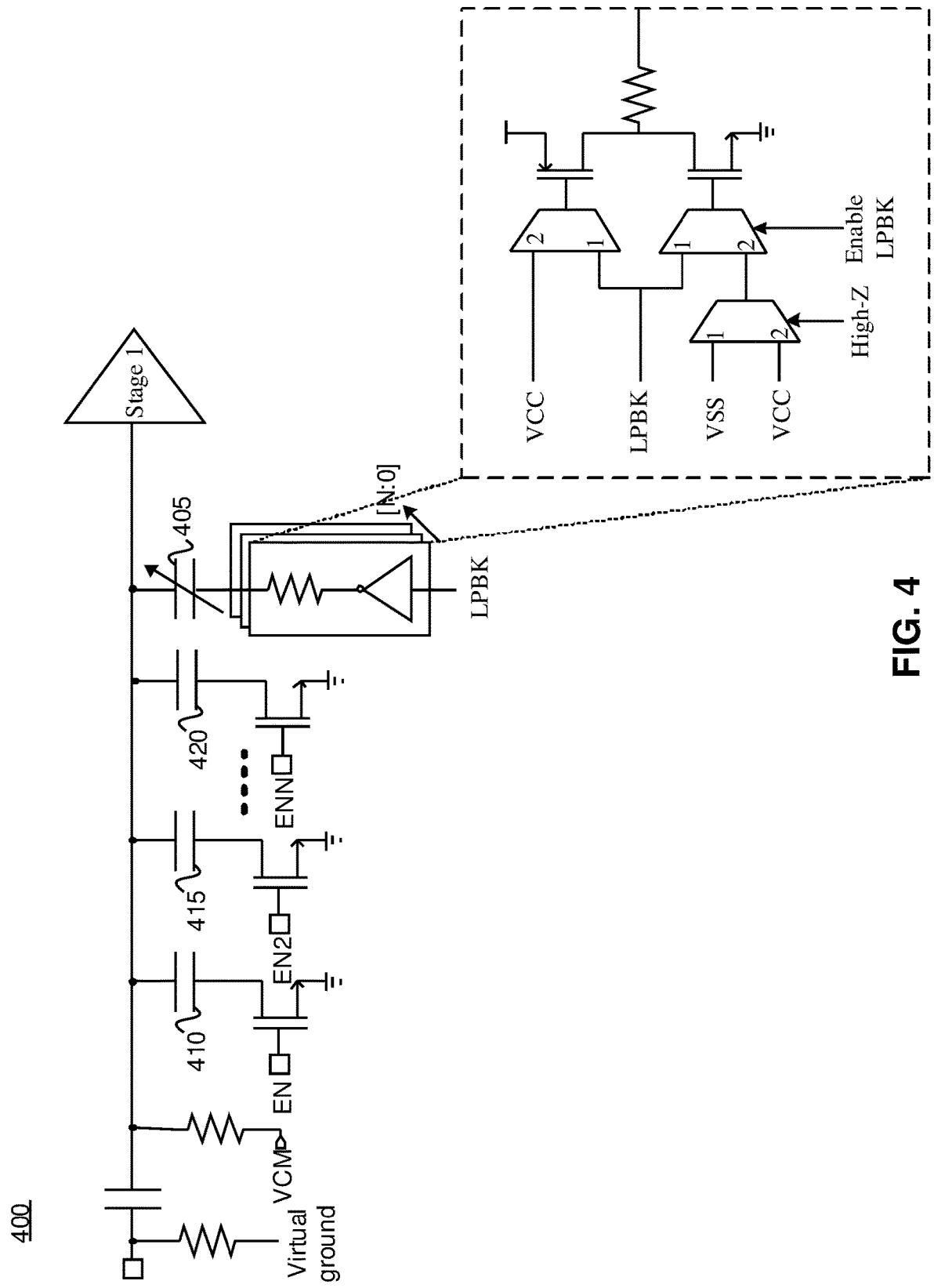
FIG. 4 illustrates a single ended AC coupled input network of a SerDes and a plurality of serial loopback circuits and multiple parallel shunt capacitors according to embodiments.

FIG. 4 illustrates an embodiment where only one of the shunt capacitors 405 is reused by the loopback test circuit. The other shunt capacitors in the mission mode 410, 415, and 420 are left as-is.

Figure 5:
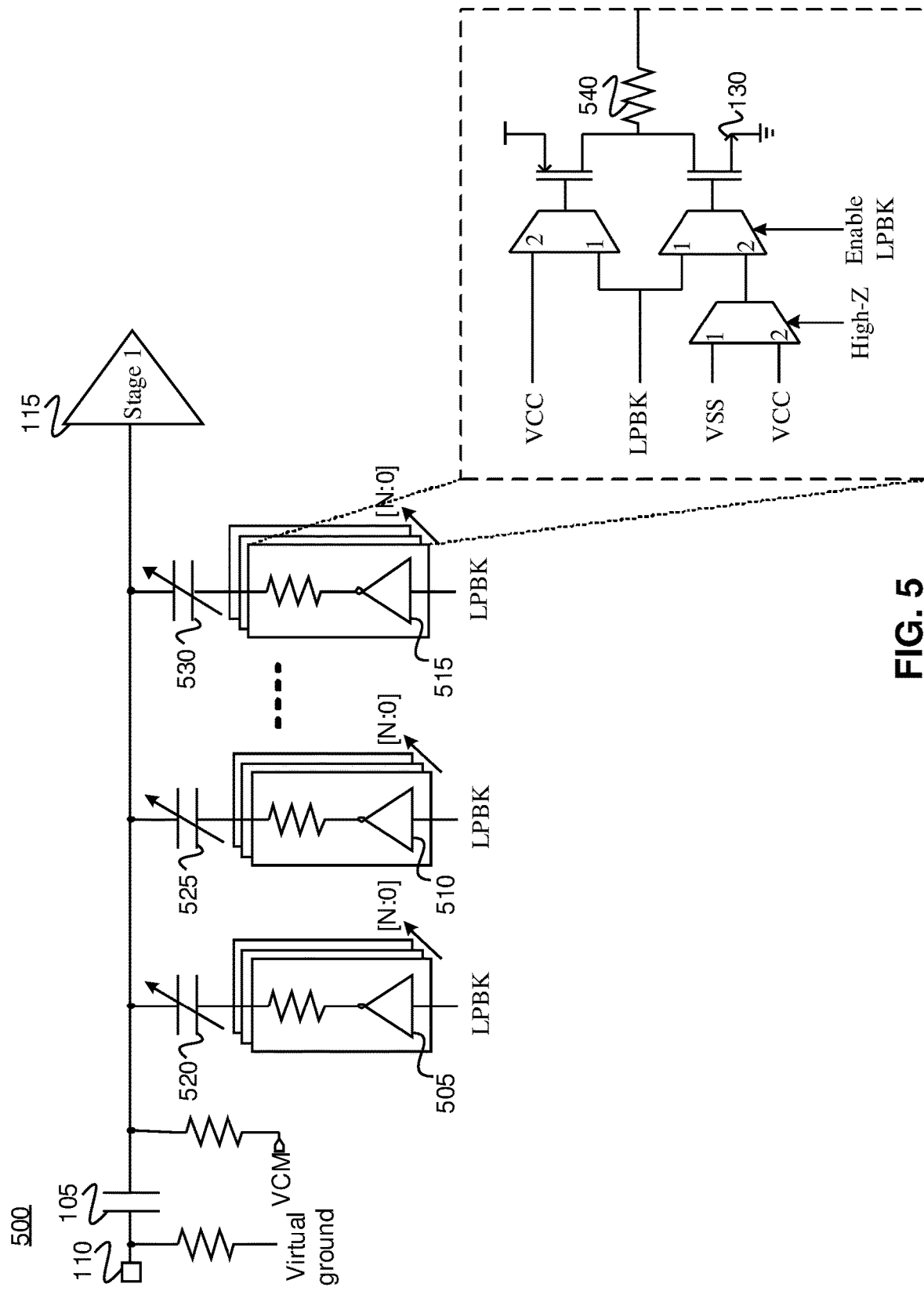
FIG. 5 illustrates a single ended AC coupled input network of a SerDes and a plurality of parallel shunt capacitors and serial loopback circuits according to embodiments.

FIG. 5 illustrates an alternative embodiment of that illustrated in FIG. 4. FIG. 5 illustrates that each unit shunt capacitor can be paired with a loopback buffer. Shunt capacitor 520 is paired with loopback buffer 505, shunt capacitor 525 is paired with loopback buffer 510, and shunt capacitor 530 is paired with loopback buffer 515. The shunt capacitor and paired loopback buffers are connected in parallel and the signal strength of the loopback signal applied to amplifier 115 is controlled by activating or deactivating the loopback buffers. The original switch 130 is split among N loopback buffer slices. In some embodiments, when resistor 540 is present, it can be used to tune the frequency transfer function for both mission mode and loopback test mode paths.

Figure 6:
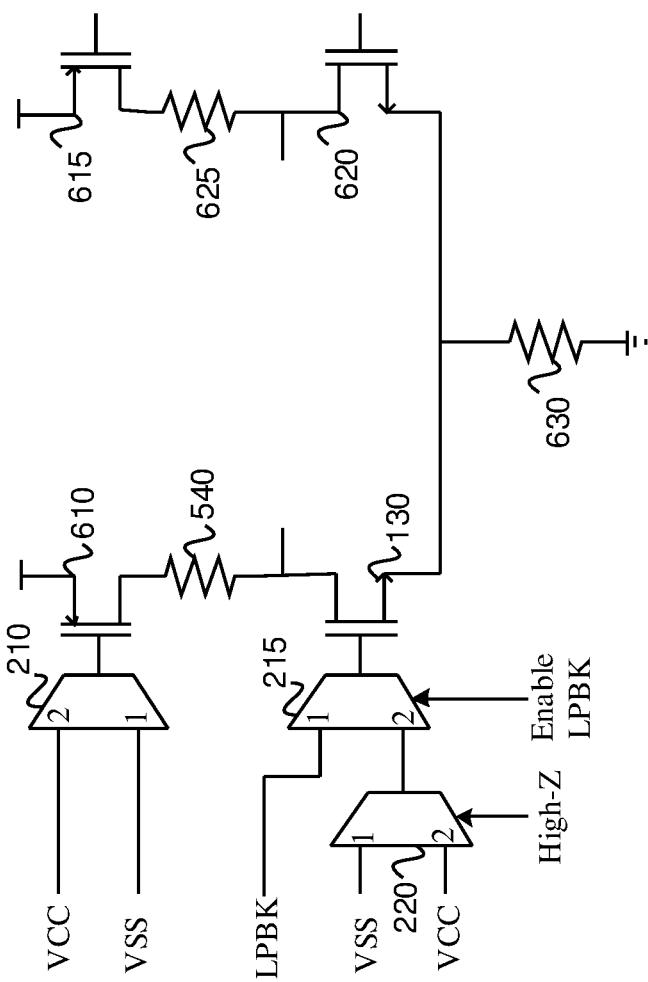
FIG. 6 illustrates a linear buffer according to embodiments.

The embodiments illustrated by FIGS. 1, 2, 3, 4, and 5 all include a buffer that can be linear or non-linear. A simple non-linear inverter is illustrated by FIGS. 1 to 5. An effective linear realization of this inverter is illustrated in FIG. 6. FIG. 6 has the same general requirement for injecting loopback through the shunt capacitor (not shown) and the need to repurpose transistor 130 from a switch in mission mode to a component in the buffer, injector, or amplifier. The linear solution achieves all objectives with no increase in overall complexity. A differential pair can be formed as components 610, 130, 615, and 620 of the linear buffer (when operated in loopback mode) and steers a current across resistors 540 and 625. The loopback signal is propagated by this differential pair by switch 215 when port 1 is active. For the transistor pair 130 and 620 to operate in the active region, transistors 610 and 615 are operated in full overdrive (i.e. $V_{SS}$ at their gates) by selecting port 1 of selector 210. Transistors 610 and 615 are in triode in this situation and its resistance contributes to resistors 540 and 625. Finally, the voltage developed across resistors 540 and 625 is applied to the shunt capacitor (not shown) for injection to the input. Mission mode operation is achieved by deactivating transistors 610 and 615 by selecting port 2 on selector 210 and selecting port 2 on selectors 215 and 220. Transistors 130 and 620 are in triode and become the activation switch. The bias resistor 630 does not contribute to the differential ON resistance seen by each shunt capacitor (not shown) since it is at a different ground node. The same principle in regards to unit slices applies here in the same way it did for embodiments illustrated by FIGS. 1, 2, 3, 4, and 5. The embodiment illustrated in FIG. 6 can support a full linear path from the transmitter to the partner receiver. This embodiment can also allow test and validation of the transmit side finite impulse response filter when this filter is either present or present and available.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

I claim:

1. An interface network comprising:
an AC coupling capacitor interposed between input pins of the interface network and an input of an amplifier;
a shunt capacitor interposed between the AC coupling capacitor and the input of the amplifier; and
a selector including a mission mode circuit component connected to a bottom plate of the shunt capacitor, the selector configured to select between a first mode and a second mode, wherein the first mode is mission mode and the second mode is loopback mode, wherein in the second mode the mission mode circuit component forms at least part of a circuit that supplies a loopback signal.

2. The interface network of claim 1 wherein in the second mode the selector forms at least part of an injection element wherein the injection element supplies the loopback signal.

3. The interface network of claim 2 wherein the injection element is a driver or a buffer or an amplifier.

4. The interface network of claim 2, wherein the loopback signal supplied to an input of the injection element is integrated on-die and wherein the loopback signal is an output of at least one on-die transmitter.

5. The interface network of claim 1 wherein the interface network is a single ended interface network or a differential interface network.

6. The interface network of claim 1 wherein the shunt capacitor has a configurable capacitance or a fixed capacitance.

7. The interface network of claim 1 wherein the selector has a configurable resistance or a fixed resistance.

8. The interface network of claim 1 wherein the configurable resistance of the selector is adjusted to equalize losses occurring as the loopback signal propagates from a transmitter to a receiver.

9. The interface network of claim 1 wherein in the second mode the interface network has a transfer function wherein the transfer function is adjusted by configuring one or more of a capacitance of the shunt capacitor and a resistance of the selector.

10. The interface network of claim 9 wherein in the second mode, the transfer function of the interface network is complementary of the transfer function of the interface network in the first mode.

11. The interface network of claim 1 wherein in the second mode, the interface network has a wide band bandwidth in line with a bandwidth of the interface network in the first mode.

12. The interface network of claim 1, wherein the second mode achieves full functional test coverage.

13. The interface network of claim 1, wherein the second mode is electrostatic discharge (ESD) robust.

14. The interface network of claim 1, wherein the second mode is immune to the direct current (DC) state of a transmitter connected to the mission mode input of the interface network.

15. The interface network of claim 1 wherein steady-state amplitude of the loopback signal is adjusted by adjusting a capacitance ratio between the AC coupling capacitor and the shunt capacitor.

16. The interface network of claim 1, wherein a transmitter and a receiver of the interface network are included on-die.

\* \* \* \* \*